United States Patent [19]
Sliva

[11] 4,085,321
[45] Apr. 18, 1978

[54] MULTI-PHASE PHOTOACTIVATED SWITCH
[75] Inventor: Philip O. Sliva, Fairport, N.Y.
[73] Assignee: Xerox Corporation, Stamford, Conn.
[21] Appl. No.: 694,124
[22] Filed: Jun. 8, 1976
[51] Int. Cl.² .............................................. H01J 39/12
[52] U.S. Cl. ............................ 250/211 R; 250/213 A; 338/15
[58] Field of Search ............ 250/211 R, 211 J, 213 R, 250/213 A; 338/15

[56] References Cited
U.S. PATENT DOCUMENTS

| 2,837,660 | 6/1958 | Orthuber et al. | 250/213 |
|---|---|---|---|
| 3,033,989 | 5/1962 | Kazan | 250/213 |
| 3,204,159 | 8/1965 | Bramley et al. | 250/211 J X |
| 3,902,185 | 8/1975 | Hayakawa | 250/213 R X |
| 3,944,332 | 3/1976 | Tutihasi | 250/213 R X |
| 3,958,207 | 5/1976 | Tutihasi | 338/15 |

Primary Examiner—Rudolph V. Rolinec
Assistant Examiner—Vincent J. Sunderdick

[57] ABSTRACT

A method for obtaining increased flexibility and responsiveness in solid state switching devices to effect a change in voltage or field and a corresponding switching device for obtaining such result, wherein the charge transport component of the photoactivated switch is functionally separate and distinct from the photoconductive charge-generating component, the former being initially selected to provide the necessary changes with respect to voltage or field while simultaneously maintaining constant photoconductive parameters such as dark decay, spectral range, etc. in the latter component.

19 Claims, 4 Drawing Figures

MULTI-PHASE PHOTOACTIVATED SWITCH

BACKGROUND OF THE INVENTION

This invention relates to a method and device for obtaining increased flexibility in photoactivated switching with respect to selected voltages or fields for obtaining a response by piezoelectric, electro-optic, piezooptic, ferroelectric or electroluminescent field or voltage activated devices.

While the perfect non-mechanical relay or switch remains a sought after goal, the main characteristics of such a device are well known. For instance, it is desirable that a solid state switch be fast and very sensitive to the switch activating force of whatever nature, and that charge leakage across the switch be minimized or a minimum activating threshold established.

In addition, it is often necessary and desirable to maintain not only a controlled voltage change but also establish a limiting response to a maximum intensity consistent with the particular device to be switched while simultaneously maintaining constant photoconductive properties such as dark decay, optical density, spectral range, etc.

It is an object of the present invention to approach the above parameters and to obtain a light or radiation-activated solid state switching device in which variable thresholds of sensitivity are obtained and, in which suitable voltages or fields are realized for effecting a full response in field or voltage-activated electric devices.

DETAILED DESCRIPTION OF THE INVENTION

Figure 1:
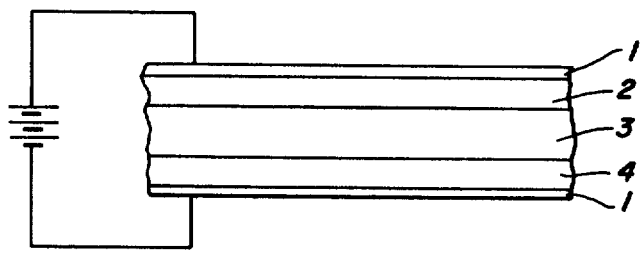

The above objects are obtainable within the present invention wherein voltages or fields can be controlled to effect a switching response in a field or voltage-activated device by utilizing a charge transport layer and photoconductive material as primary components in a photoactivated switching element arranged in series in a field, the charge transport layer being substantially permeable to the light or radiation absorbed by the photoconductive material, said charge transport and said photoconductive material being arranged in intimate charge transporting contact but functionally independent with respect to dielectric properties in the presence or absence of the activating illumination or radiation.

Multi-phase photoactivated devices suitable for carrying out the above purposes comprise, in combination, two electrodes, at least one of which is substantially light or radiation permeable, the electrodes being oppositely and externally arranged in a field circuit with respect to (1) a field- or voltage-activated electrical device, and (2) a switching element consisting essentially of at least one electron- or hole-transport material and at least one photoconductive material, the transport material and the photoconductive material being functionally independent and intimately arranged with respect to each other, said switching element being arranged in series in the field circuit and in proximity to the light or radiation permeable electrode. For such purpose, the transport material and the photoconductive material of the switching element is present either in separate contacting layers within the switching element or obtained by distributing the photoconductive material as discrete particles within the transport material. The latter arrangement is inclusive of discrete contacting particles.

Devices falling within the scope of the present invention are schematically shown in FIGS. 1–4 wherein element (1), (1a-1b), (5) and (7) represent an electrode or electrical contact such as a charge conductive plate or a thin metal coated base such as NESA glass or the like, one electrode being substantially light- or radiation-permeable; (2) and (2a–b) represent photoconductive material as hereinafter defined; (3) and (3a–b) represent electron- or hole-transport material as hereinafter defined; (4), (4a–b) and (6) represent a suitable electronic or other device to be actuated or activated by the photoactivated switching element, and includes field or voltageactivated devices such as piezoelectric, electro-optic, piezooptic, ferroelectric or an electroluminescent or similar devices; (7) represents a thin metallic film acting as a charge conductive layer or electrode as above noted, and (8) is defined as a switching element comprising one or more photoconductive materials and a transport layer as above and hereinafter defined.

Suitable light permeable electrodes, contacts or plates within the definition of elements (1), (1a–c), supra, include very thin coatings of tin oxide, copper, brass, zinc, aluminum, nickel or other suitable charge conductive metals electrically and chemically compatible with the photoconductive or charge transport material with which they are in contact.

Photoconductive materials suitable for use in the present invention are preferably, although not exclusively, inorganic material. Such include, for instance, a homogeneous layer of a single material such as vitreous selenium, selenium alloy, or it may be a composite layer containing photoconductor and electron or hole transfer material as a matrix. Included within both forms are selenium alloys inclusive of alloys of selenium with tellurium, germanium, antimony, bismuth and arsenic and/or one or more halogens such as chlorine, bromine, or iodine. Such photoconductive materials are obtainable, for instance, by subjecting selenium plus small amounts of arsenic, etc., and halogen to heat.

Where discrete photoconductive particles are employed, such can include both inorganic crystalline and inorganic photoconductive glasses such as cadmium sulfoselenide, cadmium selenide, cadmium sulfide, and mixtures thereof. Inorganic photoconductive glasses include the previously listed amorphous selenium, and selenium alloys such as selenium-tellurium and selenium-arsenic and can also be used in the crystalline form such as trigonal selenium.

Useful photoconductive organic materials include phthalocyanine pigments such as the X-form of metal-free phthalocyanine described in U.S. Pat. No. 3,357,989 metal phthalocyanine, such as copper phthalocyanine; quninacridones available from DuPont under the tradename Monastral Red, Monastral Violet, and Monastral Red Y; substituted 2,4-diamino-triazines disclosed by Weinberger in U.S. Pat. No. 3,445,227; triphenodioxazines disclosed by Weinberger in U.S. Pat. No. 3,442,781; polynuclear aromatic quinones available from Allied Chemical Corp. under the tradename Indofast Double Scarlet, Indofast Violet Lake B, Indofast Brilliant Scarlet, and Indofast Orange. Such are best although not exclusively utilized as a homoeneous layer (FIG. 1). The above list of photoconductors should in no way be taken as limiting, but is merely illustrative of suitable materials.

Electron or hole transport material for use in the switching element of the present invention can usefully include any suitable transparent organic polymer or non-polymeric material capable of supporting the injection of photo-excited holes (electrons) from the photoconductive pigment and allowing the transport of these holes (electrons) through the active matrix to selectively discharge a surface charge. Polymers having this characteristic have been found to contain repeating units of a polynuclear aromatic hydrocarbon which may also contain hereoatoms such as; for example, nitrogen, oxygen, or sulfur. Typical polymers include poly-N-vinylcarbazole (PVK), poly-1-vinylpyrene (PVP), poly-9-vinylanthracene, polyacenaphthalene, poly-9-(4-pentenyl)-carbazole, poly-9-(5-hexyl)-carbazole, polymethylene pyrene, poly-1-(- pyrenyl)-butadiene and N-substituted polymeric acrylic acid amides of pyrene. Also useful are derivatives of such polymers including alkyl, nitro, amino, halogen, and hydroxy substituted polymers. Within the scope of such polymers are poly-3-amino carbazole, 1,3-dibromo-poly-N-vinylcarbazole and 3,6-dibromo-poly-N-vinylcarbazole. Of particular interest in this connection are derivatives of the formula:

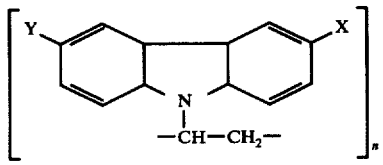

where X and Y are substituents and $n$ is an integer. Also included are structural isomers of such polymers exemplified by poly-N-vinylcarbazole, poly-2-vinylcarbazole, and poly-3-vinylcarbazole, and also copolymers such as N-vinylcarbazole/methyl acrylate copolymer and 1-vinylpyrene/butadiene ABA, and AB block polymers. Further included are non-polymeric transport materials such as carbazole, N-ethylcarbazole, N-phenylcarbazole, pyrene, tetrapyrene, 1-bromopyrene, 1-ethylpyrene, 1-methylpyrene, perylene, 2-phenylindole, tetracene, picene, 1,3,6,8-tetraphenylpyrene chrysene, fluorene, fluorenone, phenanthrene, triphenylene, 1,2,5,6-dibenzanthracene, 1,2,3,4-dibenzanthracene, 2,3-benzopyrene, anthraquinone, dibenzothiophene, bis(4-diethylamino-2-methylphenyl)phenylmethane, naphthalene, and 1-phenylnaphthalene. When desired, non-polymer materials as listed above can also be combined with either an active polymeric material or a non-active polymeric binder. Typical examples include suitable mixtures of carbazole in poly-N-vinylcarbazole as an active polymer and carbazole in a non-active binder. Such non-active binder materials include polycarbonates, acrylate polymers, polyamides, polyesters, polyurethanes and cellulose polymers.

Practically any electronic field-or voltage-activated device can be used in the present invention, inclusive of piezoelectric, electro-optic, piezo-optic or electroluminescent devices, it being noted that a suitable transport layer is best selected through the use of the following equations to tailor the dielectric properties of the switch to provide the optional required changes in voltage or field to drive the device to be switched while maintaining constant photoconductive properties. The basic equations for device operation are as follows, wherein

EQUATION I $$\vec{D}_1 = \vec{D}_2 = \vec{D}_3$$

describes the conservation of electric displacement across co-laminar dielectric elements. Developing this relationship, it is found that:

EQUATION II $$\frac{\epsilon_1 V_1}{L_1} = \frac{\epsilon_2 V_2}{L_2} = \frac{\epsilon_3 V_3}{L_3}$$

when the voltage across the three elements is held constant, the relationship

EQUATION III $$V = V_1 + V_2 + V_3$$

applies; where $V_3$ is the voltage across the device to be operated. The relationship is represented by:

EQUATION IV $$V_3 = V - V_1 - V_2$$

or

EQUATION V $$V_3 = V - \frac{\epsilon_3 L_1 V_3}{L_3 \epsilon_1} - \frac{\epsilon_3 L_2 V_3}{\epsilon_2 L_3}$$

or

EQUATION VI $$\frac{V}{\left[ (1 + \frac{L_1}{L_3} \frac{\epsilon_3}{\epsilon_1} + \frac{L_3}{L_3} \frac{\epsilon_3}{\epsilon_2}) \right]}$$

Assuming, for example, that a Se photoconductive layer is utilized, that the transport layer is poly-n-vinylcarbazole, and that the element to be activated is a piezoelectric ceramic such that:

Generator: $L_1 \approx 1\mu$  $\epsilon_1 \approx 6$
Transporter: $L_2 \approx 10\mu$  $\epsilon_2 \approx 3$
Device: $L_3 \approx 200\mu$  $\epsilon_3 \approx 3000$.

it is found initially (in the dark) that $$V_3 = \frac{V}{1 + \frac{1}{200} \frac{300}{6} + \frac{10}{200} \frac{3000}{3}}$$

$$= \frac{V}{53.3}$$

and that when the voltage is collapsed across the photoconductive generator and transport layer $V_3 = V$, that one may expect $a \approx 50$ fold increase in voltage across the element.

For purposes of tailoring the functionally independent transport layer, as above defined, to the device to be switched, it must also be kept in mind that it can be expedient to utilize a transparent material with respect to the activating light to permit either rear or front access to the photoconductive (i.e., generating) layer.

Generally speaking, for purpose of the present invention, the resistivity of the materials providing dielectric thickness of the device can be very high and the photoconductive (generating) layer, if desired, be made very thin in order to minimize the effect of thermal generation of charge carriers in bulk, in the absence of activating illumination. In effect, this tends to prevent slow switching by preventing the build up of charge at the interface with the transport layer. Where a transport layer is utilized having a higher carrier mobility, however, the speed of the switch element can be directly controlled by varying the intensity of the activating light or radiation. Where, on the other hand, independence of the activating light intensity or an upper threshold is desired, it is easily accomplished merely by choice and thickness of material having a relatively low carrier mobility.

The thickness of a transport layer such as that of element (3) in FIG. 1 can usefully vary from about 1 - 150 microns or more, depending upon the field strength, dielectric properties, and carrier mobility of the component parts of the switching element. Generally speaking, however, a ratio in the thickness of transport-to-photoconductive layer can be maintained from about 2:1 to 400:1. Again, with respect to FIG. 1 (element 2) the photoconductive layer can vary from about 0.1 – 20 microns and preferably about 0.5 – 5 microns in thickness on a charge transport layer of up to about 150 microns.

Figure 2:
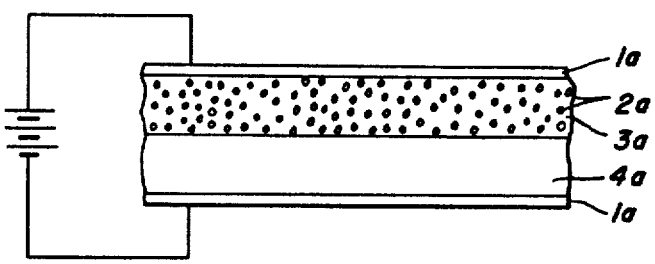
Figure 3:
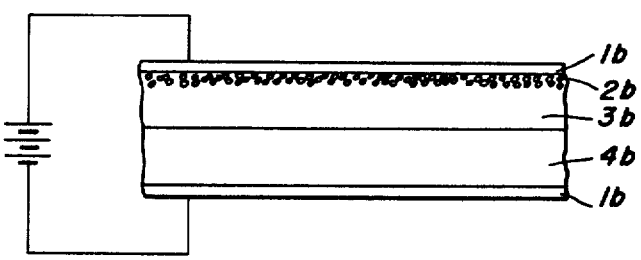
Figure 4:
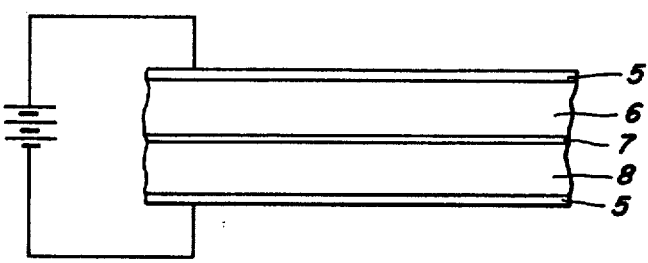

With respect to FIGS. 2 and 3, where the switching element ($1a$–$3a$) utilizes photoconductive material in the form of discrete particles incorporated within the transport layer, a total thickness of about 2 – 150 microns and a range of about 0.1 – 30 percent by volume of photoconductive particles is considered sufficient but not limiting. The particle size of the photoconductive material is not crucial in the latter situation and can usefully range from about 0.2 – 10 microns or larger.

By varying one or both of the activating light intensity and the carrier mobility, the switching time can be maintained at a desired range from microseconds-to-seconds in duration to meet the needs of the device being switched, and its function.

By way of further example, a diode can be switch controlled in accordance with the present invention by following the above disclosure.

Where a switching diode with a hold off voltage of 75V and a switching voltage of $\approx$ 100V is to be operated by means of a 100V power supply, and assuming a $1\mu$ thick selenium photoconductive layer similar to that of FIG. 1 is utilized and a charge transport layer of poly-N-vinylcarbazole is desired, the following parameters are developed:

$L_1 = 1\mu$, $\epsilon_1 = 6$
$L_2 = $ to be determined, $\epsilon_2 = 3$
$L_3 = 127\mu$ (5 mils), $\epsilon_3 = 10$ The diode characteristics of $L_3 = 127\mu$ and a dielectric constant of 10 are representative (approximately) of switching diodes and the dielectric constants of Si and Ge, respectively. Using Equation VI, it is found that:

$$V_3 = \frac{V_{power\ supply}}{1 + \frac{L_1}{L_1}\frac{\epsilon_3}{\epsilon_1} + \frac{L_2}{\epsilon_3}\frac{\epsilon_3}{\epsilon_2}};$$

the thickness of the transport layer to accomplish this is calculated as $12.3\mu$.

EXAMPLE I

A photoactivated switch for operating a switching diode having the following parameters: Holding voltage 75V; power supply = 100 volt; dielectric constant = 10; characteristics = $127\mu$, is calculated from the equation $$V_3 = \frac{V_{power\ supply}}{1 + \frac{L_1}{L_1}\frac{\epsilon_3}{\epsilon_1} + \frac{L_2}{\epsilon_3}\frac{\epsilon_3}{\epsilon_2}}$$

wherein
$L_1 = 1\mu$: $\epsilon_2 = 3$
$L_2 = $ : $\epsilon_3 = 10$
$L_3 = 127\mu$ (5 mil).

the $V_3$ (transport layer) best suited for switching purposes is estimated to be $12.3\mu$ thick (see Equations I - VI, supra). A switching element is constructed as follows: A 2 inch $\times$ 2 inch test strip of NESA glass is placed in a vacuum coater at $1 \times 10^{-6}$ Torr about 3 inches above an open shuttered self-heating stainless steel crucible maintained at about 280° C. and containing a 5 percent arsenic/selenium alloy. After 1.5 minutes, the crucible shutter is closed and the coater permitted to return to ambient conditions. The selenium alloy ($1\mu$) coated NESA glass is then sprayed with a 3 percent toluene solution of poly-N-vinylcarbazole and air dried for 16 hours to obtain a coating of about 12.3 microns thickness of carrier layer over the previously applied selenium photocontive layer. A gold electrode is then vapor coated onto the carbazole and terminals affixed to the NESA glass and gold layers. The resulting device is connected in series to a switching diode in a 100 volt power supply and activated with a low intensity white light (20 ergs/cm$^2$). The operating parameters of a device so obtained will be substantially as calculated, with allowance for deviation in thickness of the transport layer.

EXAMPLE II

Example I is repeated but with a piezoelectric ceramic, the parameters being predetermined as follows:

Generator — $L_1 \approx 1\mu$ $\epsilon_1 \approx 6$
Transporter — $L_2 \approx 10\mu$ $\epsilon_2 \approx 3$
Device — $L_3 \approx 200\mu$ $\epsilon_3 \approx 3000$.

Utilizing Equation VI (supra) it is found that when the voltage is collapsed across the generator and transport layer of the switch $V_3 = V$ and approximately a 50 fold increase in voltage is obtained across the element. Utilizing Barium Titanate as the piezo-electric ceramic, the above voltage increase can be closely approximated.

EXAMPLE III

Example I is repeated but with a piezoelectric ceramic, the parameters being predetermined as follows:

Generator — $L_1 \approx 1\mu$ $\epsilon_1 \approx 6$
Transporter — $L_2 \approx 10\mu$ $\epsilon_2 \approx 3$
Device — $L_3 \approx 200\mu$ $\epsilon_3 \approx 3000$.

Utilizing Equation VI (supra) it is found that when the voltage is collapsed across the generator and transport layer of the switch $V_3 = V$ and approximately a 50 fold increase in voltage is obtained across the element.

Utilizing Lithium Niobate as the piezo-electric ceramic, the above voltage increase can be closely approximated.

EXAMPLE IV

Example I is repeated but with a piezoelectric ceramic, the parameters being predetermined as follows:

Generator — $L_1 \approx 1\mu$ $\epsilon_1 \approx 6$
Transporter — $L_2 \approx 10\mu$ $\epsilon_2 \approx 3$
Device — $L_3 \approx 200\mu$ $\epsilon_3 \approx 3000$.

Utilizing Equation VI (supra) it is found that when the voltage is collapsed across the generator and transport layer of the switch $V_3 = V$ and approximately a 50 fold increase in voltage is obtained across the element. Utilizing Potassium Niobate as the piezo-electric ceramic, the above voltage increase can be closely approximated.

What is claimed is:

1. A multiphase photoactivated device comprising, in combination, two electrodes at least one of which is substantially light or radiation permeable, the two electrodes being oppositely and externally arranged in a field circuit with respect to
   (1) a field or voltage-activated electrical device, and
   (2) a switching element consisting essentially of at least one electron- or hole-transport material and at least one photoconductive material; the ratio in thickness of the transport material to the photoconductive material being about 2:1 to 400:1, said materials being functionally independent and intimately arranged with respect to each other, while the switching element as defined is arranged in series in the field circuit in proximity to a light or radiation-permeable electrode.

2. The photoactivated device of claim 1, wherein the field responsive electrical device is a piezoelectric, an electro-optic, a piezo-optic, a ferroelectric or an electroluminescent device.

3. The photoactivated device of claim 2 wherein the photoconductive material and the transport material of the switching element are arranged in separate contacting layers within the switching element.

4. The photoactivated device of claim 2 wherein the photoconductive material of the switching element is distributed as discrete particles within the transport material.

5. The photoactivated device of claim 4 wherein the photoconductive material of the switching element is distributed as discrete contacting particles.

6. The photoactivated device of claim 1 wherein the transport material of the switching element is a polynuclear aromatic hydrocarbon and the photoconductive material is isotropic with respect to the exciting radiation or light, and is capable of injecting photoexcited holes into the transport material.

7. The photoactivated device of claim 3 wherein the transport material of the switching element is one or more of a poly-N-vinylcarbazole, poly-1-vinylpyrene, poly-9-vinylanthracene, polyacenaphthalene, poly-9-(4-pentenyl)-carbazole, poly-9-(5-hexyl)-carbazole, polymethylene pyrene, poly-1-(- pyrenylbutadiene or a N-substituted polymeric acrylic acid amide of pyrene.

8. The photoactivated device of claim 4 wherein the transport material of the switching element is one or more of a poly-N-vinylcarbazole, poly-1-vinylpyrene, poly-9-vinylanthracene, polyacenaphthalene, poly-9-(4-pentenyl)-carbazole, poly-9-(5-hexyl)-carbazole, polymethylene pyrene, poly-1-(- pyrenyl)-butadiene or N-substituted polymeric arylic acid amide of pyrene.

9. A solid state photo- or radiation-activated element comprising, in combination, at least one light permeable charge conductive base, a electron- or hole-transport layer and photoconductive material in electrical contact with material of the transport layer, said photoconductive material being positioned adjacent to a light permeable electrode or used in combination with transport layer material permeable to the exciting light or radiation to which the switch element is responsive, the ratio, in thickness, of transport material-to-photoconductive material being about 2:1 to 400:1.

10. The switching element of claim 9 wherein the photoconductive material and the transport material of the switching element are arranged in separate electrically contacting layers.

11. The switching element of claim 9 wherein the photoconductive material is essentially incorporated within the charge transport layer.

12. The switching element of claim 9 wherein material of the charge transport layer comprises one or more of a poly-1-vinylcarbazole, poly-1-vinylpyrene, poly-9-vinylanthracene, polyacenaphthalene, poly-9-(4-phetenyl)-carbazole, poly-9-(5-hexyl)-carbazole, polymethylene pyrene, poly-1-(- pyrenyl)-butadiene or N-substituted polymeric acrylic acid amide of pyrene.

13. The switching element of claim 10 wherein the photoconductive material is amorphous selenium or a selenium alloy and the charge transport layer consists essentially of polyvinylcarbazole or a polyvinylpyrene.

14. The switching element of claim 11 wherein the photoconductive material is at least one of a cadmium sulfoselenide, cadmium selenide, cadmium sulfide, amorphous selenium, selenium-tellruium alloy trigonal selenium or selenium-arsenic alloy, and the charge transport layer consists essentially of a polyvinylcarbazole or a polyvinylpyrene.

15. A method for controlling speed and degree of switching response in conjunction with a field or voltage-activated device, comprising utilizing a charge transport layer and photoconductive material at a ratio in thickness of about 2:1 to 400:1 as primary components in a photoactivated switching element arranged in series in the field, the charge transport layer being substantially permeable to the light or radiation absorbed by the photoconductive material, said charge transport and photoconductive material being arranged in intimate charge transporting contact but functionally independent with respect to dielectric properties in the presence or absence of the activating illumination radiation.

16. The method of claim 15 wherein the photoconductive material in the switching element is present as a separate film or layer in contact with the light permeable charge transport material.

17. The method of claim 2 wherein the photoconductive material is present as discrete particles within a matrix.

18. The method of claim 2 wherein the photoconductive material is present as discrete particles within a charge transport layer.

19. The method of claim 15 wherein the charge transport material is a poly-N-vinylcarbazole, poly-1-vinylpyrene, poly-9-vinylanthracene, polyacenaphthalene, poly-9-(4-pentenyl)-carbazole, poly-9-(5-hexyl)-carbazole, polymethylene pyrene, poly-1-(- pyrenyl)-butadiene or N-substituted polymeric arylic acid amide of pyrene.

* * * * *